US006503684B1

(12) United States Patent
Vermeersch et al.

(10) Patent No.: US 6,503,684 B1
(45) Date of Patent: *Jan. 7, 2003

(54) PROCESSLESS THERMAL PRINTING PLATE WITH COVER LAYER CONTAINING COMPOUNDS WITH CATIONIC GROUPS

(75) Inventors: Joan Vermeersch, Mortsel (BE); Marc Van Damme, Mortsel (BE)

(73) Assignee: Agfa-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/584,490

(22) Filed: Jun. 1, 2000

Related U.S. Application Data

(60) Provisional application No. 60/143,664, filed on Jul. 14, 1999.

(30) Foreign Application Priority Data

Jun. 29, 1999 (EP) .......................................... 99202108

(51) Int. Cl.[7] ................................................ G03F 7/09

(52) U.S. Cl. ................................ 430/270.1; 430/273.1; 430/303; 430/348; 430/944; 430/945; 101/453; 101/463.1; 101/467

(58) Field of Search .............................. 430/138, 270.1, 430/271.1, 273.1, 302, 303, 944, 945, 348; 101/453, 463.1, 465, 467

(56) References Cited

U.S. PATENT DOCUMENTS

| | | | | | |
|---|---|---|---|---|---|
| 5,550,002 | A | * | 8/1996 | Kojima et al. | 430/258 |
| 5,607,810 | A | * | 3/1997 | Verburgh et al. | 430/201 |
| 5,905,015 | A | * | 5/1999 | Van der Linden et al. | 430/204 |
| 6,010,817 | A | * | 1/2000 | Van Damme et al. | 430/200 |
| 6,014,930 | A | * | 1/2000 | Burberry et al. | 101/456 |
| 6,080,523 | A | * | 6/2000 | Vermeersch et al. | 430/270.1 |
| 6,083,663 | A | * | 7/2000 | Vermeersch et al. | 430/302 |
| 6,190,830 | B1 | * | 2/2001 | Leon et al. | 430/270.1 |
| 6,197,478 | B1 | * | 3/2001 | Vermeersch et al. | 430/272.1 |
| 6,207,348 | B1 | * | 3/2001 | Deboer et al. | 430/302 |
| 6,210,857 | B1 | * | 4/2001 | Vermeersch et al. | 430/270.1 |
| 6,230,621 | B1 | * | 5/2001 | Verschueren et al. | 101/453 |
| 6,300,032 | B1 | * | 10/2001 | Van Damme et al. | 430/188 |
| 6,340,815 | B1 | * | 1/2002 | Verschueren et al. | 250/318 |
| 6,391,516 | B1 | * | 5/2002 | Vermeersch et al. | 430/270.1 |
| 6,399,276 | B1 | * | 6/2002 | Van Damme et al. | 430/273.1 |
| 2002/0033108 | A1 | * | 3/2002 | Akiyama et al. | 101/457 |

FOREIGN PATENT DOCUMENTS

| | | | | |
|---|---|---|---|---|
| EP | 0 514 990 | A1 | | 11/1992 |
| EP | 573 092 | A1 | * | 12/1993 |
| EP | 599 510 | A2 | * | 6/1994 |
| EP | 0 703 499 | A1 | | 3/1996 |
| EP | 0 816 070 | A1 | | 1/1998 |
| EP | 0 849 090 | A2 | | 6/1998 |
| EP | 0 849 090 | A3 | | 7/1998 |
| GB | 2 325 055 | A | | 11/1998 |
| WO | WO 94/16904 | | | 8/1994 |

* cited by examiner

*Primary Examiner*—Janet Baxter
*Assistant Examiner*—Barbara Gilliam
(74) *Attorney, Agent, or Firm*—Breiner & Breiner, L.L.C.

(57) ABSTRACT

According to the present invention there is provided a heat-sensitive material for making lithographic printing plates comprising on a lithographic support an image-forming layer comprising a hydrophilic binder, a cross-linking agent for a hydrophilic binder and dispersed hydrophobic thermoplastic polymer particles, characterized in that said image-forming layer is covered with a layer comprising at least one organic compound comprising cationic groups.

18 Claims, No Drawings

PROCESSLESS THERMAL PRINTING PLATE WITH COVER LAYER CONTAINING COMPOUNDS WITH CATIONIC GROUPS

This application claims benefit of U.S. Provisional Application No. 60/143,664 filed Jul. 14, 1999.

FIELD OF THE INVENTION

The present invention relates to a heat-sensitive material for preparing lithographic printing plates.

More specifically the invention is related to a processless heat-sensitive material that yields lithographic printing plates with high lithographic latitude.

BACKGROUND OF THE INVENTION

Lithographic printing is the process of printing from specially prepared surfaces, some areas of which are capable of accepting ink, whereas other areas will not accept ink.

In the art of photolithography, a photographic material is made image-wise receptive to oily or greasy ink in the photo-exposed (negative working) or in the non-exposed areas (positive working) on an ink-repelling background.

In the production of common lithographic plates, also called surface litho plates or planographic printing plates, a support that has affinity to water or obtains such affinity by chemical treatment is coated with a thin layer of a photo-sensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon image-wise exposure of such light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat-sensitive rather than photosensitive. A particular disadvantage of photosensitive imaging elements such as described above for making a printing plate is that they have to be shielded from daylight. Furthermore they have a problem of unstable sensitivity with regard to the storage time and they show a lower resolution. The trend towards heat-sensitive printing plate precursors is clearly seen on the market.

For example, Research Disclosure no. 33303 of January 1992 discloses a heat-sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink accepting without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

Furthermore EP-A-770 494, 770 495, 770 496 and 770 497 disclose a method for making a lithographic printing plate comprising the steps of (1) image-wise exposing to light a heat-sensitive imaging element comprising (i) on a hydrophilic surface of a lithographic base an image-forming layer comprising hydrophobic thermoplastic polymer particles dispersed in a hydrophilic binder and (ii) a compound capable of converting light to heat, said compound being comprised in said image-forming layer or a layer adjacent thereto; (2) and developing a thus obtained image-wise exposed element by rinsing it with plain water.

The above mentioned heat-sensitive imaging elements for making lithographic printing plates are not optimal regarding lithographic latitude, more particularly they need a lot of prints before the background area becomes free of printing ink.

OBJECTS OF THE INVENTION

It is an object of the present invention to provide a processless heat-sensitive imaging material for making lithographic printing plates having excellent printing properties.

It is a further object of the invention to provide a heat sensitive imaging material for making lithographic printing plates with improved lithographic latitude.

Further objects of the present invention will become clear from the description hereinafter.

SUMMARY OF THE INVENTION

According to the present invention there is provided a heat-sensitive material for making lithographic printing plates comprising on a lithographic support an image-forming layer comprising a hydrophilic binder, a cross-linking agent for a hydrophilic binder and dispersed hydrophobic thermoplastic polymer particles, characterized in that said image-forming layer is covered with a layer comprising at least one organic compound comprising cationic groups.

DETAILED DESCRIPTION OF THE INVENTION

The organic compounds having cationic groups for use in connection with the present invention are preferably hydrophilic and may be low molecular weight compounds but are preferably polymers. Preferred compounds are those having one or more ammonium groups or amino groups that can be converted to ammonium groups in an acidic medium. An especially preferred type of cationic compounds are polysaccharides modified with one or more groups containing an ammonium or amino group.

Most preferred organic compounds having cationic groups are dextrans or pullulan wherein at least some of the hydroxy groups have been modified into one or more of the following groups:

$$—O—CO—R^2$$

wherein $R^1$ represents an organic residue containing an amino or ammonium group, e.g. an amine substituted alkyl, an amine substituted alkylaryl etc.

$R^2$ has one of the significances given for $R^1$ or stands for $—OR^3$ or $—N(R^4)R^5$, wherein $R^3$ has one of the significances given for $R^1$ and each of $R^4$ and $R^5$ which may be the same or different and have one of the significances given for $R^1$.

Pullulan is a polysaccharide that is produced by micro-organism of the *Aureobasidium pullulans* type (*Pullularia pullulans*) and that contains maltotriose repeating units connected by a a-1,6 glycosidic bond. Pullulan is generally produced on industrial scale by fermentation of partially hydrolyzed starch or by bacterial fermentation of sucrose. Pullulan is commercially available from e.g. Shodex, Pharmacosmos.

Examples of dextrans or pullulan suitable for use in accordance with the present invention are dextrans or pullulan wherein some of the hydroxyl groups have been modified in one of the groups shown in table 1.

TABLE 1

| no. | modified group |
|---|---|
| 1 | $-O-CH_2-CH_2-NH_2$ |
| 2 | $-O-CO-NH-CH_2-CH_2-NH_2$ |
| 3 | $-O-CO-NH-CH_2-CH_2-N(CH_2-CH_2-NH_2)_2$ |
| 4 | $-O-CH_2-CH_2-NH-CH_2-CH_2-NH_2$ |
| 5 | $-O-CH_2-CH_2-NH-CH_2-CHOH-CH_2-N^+(CH_3)\ Cl^-$ |
| 6 | $-O-(CH_2-CH_2-O)_n-CH_2-CH_2-NH_2$ wherein n represents an integer from 1 to 50 |
| 7 | $-O-CO-NH-CH_2-CH_2-NH-CH_2-CHOH-CH_2-N^+(CH_3)_3\ Cl^-$ |
| 8 | $-O-CH_2-CH_2-N(CH_2-CH_3)_2$ .HCl |
| 9 | $-O-CH_2-CH_2-N(CH_2-CH_2-NH_2)_2$ |
| 10 | $-O-CONH-CH_2-CH_2-N(CH_2-CH_2-NH_2)_2$ |
| 11 | $-O-CONH-(CH_2-CH_2-O)_n-CH_2-CH_2-NH_2$ |

The modified dextrans or pullulan can be prepared by a reaction of a dextran with e.g. alkylating agents, chloroformates, acid halides, carboxylic acids etc.

The organic compound having one or more cationic groups according to the invention is preferably provided in an amount of 10 to 5000 mg/m$^2$ and more preferably in an amount of 20 to 1000 mg/m$^2$.

According to the present invention to improve sensitivity and throughput and to avoid scumming an imaging element is provided comprising preferably hydrophobic thermoplastic polymer particles with an average particle size between 40 nm and 2000 nm. More preferably the hydrophobic thermoplastic polymer particles are used with an average particle size of 40 nm to 200 nm. Furthermore the hydrophobic thermoplastic polymer particles used in connection with the present invention preferably have a coagulation temperature above 50° C. and more preferably above 70° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. When said polymer particles are subjected to a temperature above the coagulation temperature they coagulate to form a hydrophobic agglomerate in the hydrophilic layer so that at these parts the hydrophilic layer becomes hydrophobic and oleophilic.

Specific examples of hydrophobic polymer particles for use in connection with the present invention have a Tg above 80° C. Preferably the polymer particles are selected from the group consisting of polyvinyl chloride, polyvinylidene chloride, polyesters, polyurethanes, polyacrylonitrile, polyvinyl carbazole etc., copolymers or mixtures thereof. Most preferably used are polystyrene, polymethylmethacrylate or copolymers thereof.

The weight average molecular weight of the polymers may range from 5,000 to 5,000,000 g/mol.

The polymer particles are present as a dispersion in the aqueous coating liquid of the image-forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the image-forming layer is preferably between 2 and 40% by weight and more preferably between 10 and 20% by weight of the total weight of said layer.

Suitable hydrophilic binders for use in an image-forming layer in connection with this invention are water soluble (co)polymers for example synthetic homo- or copolymers such as polyvinylalcohol, a poly(meth)acrylic acid, a poly (meth)acrylamide, a polyhydroxyethyl(meth)acrylate, a polyvinylmethylether or natural binders such as gelatin, a polysaccharide such as e.g. dextran, pullulan, cellulose, arabic gum, alginic acid, inuline or chemically modified inuline.

A cross-linked hydrophilic binder in the heat-sensitive layer used in accordance with the present embodiment also contains substances that increase the mechanical strength and the porosity of the layer e.g. oxide particles having an average diameter of at least 100 nm. Incorporation of these particles gives the surface of the cross-linked hydrophilic layer a uniform rough texture consisting of microscopic hills and valleys. Preferably these particles are oxides or hydroxides of beryllium, magnesium, aluminum, silicon, gadolinium, germanium, arsenic, indium, tin, antimony, tellurium, lead, bismuth or a transition metal. Particularly preferable is titanium dioxide, used in 20 to 95% by weight of the heat-sensitive layer, more preferably in 40 to 90% by weight of the heat-sensitive layer.

The image-forming layer also comprises crosslinking agents. such as formaldehyde, glyoxal, polyisocyanate or a hydrolyzed tetraalkylorthosilicate. The latter is particularly preferred.

The imaging element can further include a compound capable of converting light to heat. Suitable compounds capable of converting light into heat are preferably infrared absorbing components having an absorption in the wavelength range of the light source used for image-wise exposure. Particularly useful compounds are for example dyes and in particular infrared dyes as disclosed in EP-A-908 307 and pigments and in particular infrared pigments such as carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends i.a. on the heat-sensitivity of the imaging element. In this respect it has been found that carbon black yields very good and favorable results.

A light-to-heat converting compound in connection with the present invention is most preferably added to the image-forming layer but at least part of the light-to-heat converting compound may also be comprised in a neighboring layer.

The imaging layer preferably contains surfactants that can be anionic, cationic, non-ionic or amphoteric. Perfluoro surfactants are preferred. Particularly preferred are non-ionic perfluoro surfactants. Said surfactants can be used alone or preferably in combination.

The weight of the imaging layer ranges preferably from 0.5 to 20 g/m$^2$, more preferably from 3 to 15 g/m$^2$.

The lithographic base according to the present invention can be aluminum e.g. electrochemically and/or mechanically grained and anodized aluminum.

Furthermore in connection with the present invention, the lithographic base can be a flexible support. As flexible support in connection with the present embodiment it is particularly preferred to use a plastic film e.g. substrated polyethylene terephthalate film, polyethylene naphthalate film, cellulose acetate film, polystyrene film, polycarbonate film, polyethylene film, polypropylene film, polyvinyl chloride film, polyether sulphone film. The plastic film support may be opaque or transparent. The plastic film is preferably subbed with subbing layers as described in EP-A-619 524, EP-A-619 525 and EP-A-620 502.

Still further paper or glass of a thickness of not more than 1.2 mm can also be used.

In accordance with the present invention the imaging element is image-wise exposed. During said exposure, the exposed areas are converted to hydrophobic and oleophilic areas while the unexposed areas remain hydrophilic.

Said image forming can be realized by direct thermal recording wherein the thermal transfer is effected by heat radiation, heat conductivity or inductive heat transport. It is believed that on the heated areas the hydrophobic polymer particles coagulate and form a hydrophobic area while on the non-heated areas the hydrophobic polymer particles remain unchanged and said area remains hydrophilic.

Said image-forming can also effected by irradiation with high intensity light. The heat-sensitive material should then comprise a compound capable of converting light into heat.

Image-wise exposure in connection with the present invention is preferably an image-wise scanning exposure involving the use of a laser or L.E.D. Preferably used are lasers that operate in the infrared or near-infrared, i.e. wavelength range of 700–1500 nm. Most preferred are laser diodes emitting in the near infrared.

According to the present invention the plate is then ready for printing without an additional development and can be mounted on the printing press.

According to a further method, the imaging element is first mounted on the printing cylinder of the printing press and then image-wise exposed directly on the press. Subsequent to exposure, the imaging element is ready for printing.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slid on the print cylinder instead of mounting a conventional printing plate. More details on sleeves are given in "Grafisch Nieuws", 15, 1995, page 4 to 6.

The following examples illustrate the present invention without limiting it thereto. All parts and percentages are by weight unless otherwise specified.

EXAMPLES

On top of an aluminum substrate was coated the IR-sensitive layer to a wet coating thickness of 70 μm from a solution having the following composition:

17.28 g of a $TiO_2$ dispersion in water (average particle size 0.3 to 0.5 μm)–25.97% w/w.

8.44 g of hydrolyzed tetramethylorthosilicate in water –24.86% w/w.

1 g of wetting agent –5% w/w.

9.11 9 of non-ionic stabilized polystyrene latex –12.8% w/w.

0.20 g of IR-dye A 33.95 of water.

IR-Dye A

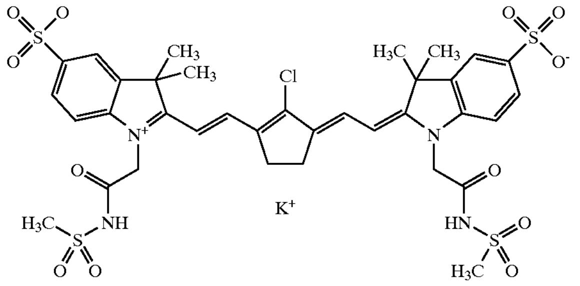

This layer was hardened for 12 hours at 67° C. and 50% R.H. Imaging element I was so obtained. Imaging elements II, III, IV, V, VI were obtained by coating on top of the imaging element I a hydrophilic layer from a 1% w/w solution from a diethylaminoethoxylated dextran (Dormacid™ from Pfeifer and Langen). The hydrophilic layer was coated to a dry coating thickness of 0.05 , 0.10, 0.25, 0.50, 0.75 g/m$^2$ respectively.

Imaging element VII was prepared by treating imaging element I with a 1% w/w solution in water of Dormacid™ by rinsing with a cotton pad soaked in the described solution.

The resulting imaging elements were imaged on a CREO 3244 Trendsetter™ at 2400 dpi operating at a drum speed of 140 rpm and a laser output of 15.5 Watt.

After imaging, the plates were mounted on a GTO 52 press using K+E 800 as ink and rotamatic as fountain.

Subsequently the press was started by allowing the print cylinder with the imaging element mounted thereon to rotate. The dampener rollers of the press were first dropped on the imaging element so as to supply dampening liquid to the imaging element and after 10 revolutions of the print cylinder , the ink rollers were dropped to supply ink. After 10 further revolutions ink was feeded. The Dmin and the dot areas of the 50% screen at 200 lpi were measured at prints 5, 25, 50. The Dmin and the dot area were measured with a Macbeth RD918-SB™.

TABLE 1

| | Dmin | | |
|---|---|---|---|
| Element | print 5 | print 25 | print 50 |
| I | 0.19 | 0.11 | 0.06 |
| II | 0.00 | 0.00 | 0.01 |
| III | 0.00 | 0.00 | 0.01 |
| IV | 0.00 | 0.00 | 0.01 |
| V | 0.01 | 0.01 | 0.01 |
| VI | 0.00 | 0.01 | 0.01 |
| VII | 0.00 | 0.00 | 0.00 |

TABLE 2

| | Dot area | | |
|---|---|---|---|
| Element | print 5 | print 25 | print 50 |
| I | 92 | 96 | 97 |
| II | 70 | 73 | 75 |
| III | 70 | 74 | 75 |

TABLE 2-continued

| | Dot area | | |
|---|---|---|---|
| Element | print 5 | print 25 | print 50 |
| IV | 66 | 62 | 74 |
| V | 69 | 74 | 74 |
| VI | 71 | 74 | 75 |
| VII | 72 | 74 | 75 |

From these results, it is clear that an additional hydrophilic top layer of a diethylaminoethoxylated dextran improves the lithographic characteristics, i.e. less toning at start-up and lower dot gain.

What is claimed is:

1. A heat-sensitive material for making lithographic printing plates comprising on a lithographic support an image-forming layer comprising a hydrophilic binder, a cross-linking agent for a hydrophilic binder and dispersed hydrophobic thermoplastic polymer particles, wherein said image-forming layer is covered with a layer comprising at least one organic compound comprising cationic groups wherein said organic compound is a hydrophilic polymer having one or more ammonium groups or a low molecular weight hydrophilic organic compound having one or more ammonium groups.

2. A heat-sensitive material according to claim 1 wherein said hydrophilic polymer is a modified polysaccharide having groups containing an amino or ammonium group.

3. A heat-sensitive material according to claim 2 wherein said modified polysaccharide is a dextran or a pullulan containing an amino or ammonium group.

4. A heat-sensitive material for making lithographic printing plates comprising on a lithographic support an image-forming layer comprising a hydrophilic binder, a cross-linking agent for a hydrophilic binder and dispersed hydrophobic thermoplastic polymer particles, wherein said image-forming layer is covered with a layer comprising at least one organic compound comprising cationic groups, and wherein said image-forming layer further comprises oxides or hydroxides of beryllium, magnesium, aluminum, silicon, gadolinium, germanium, arsenic, indium, tin, antimony, tellurium, lead, bismuth, titanium or a transition metal.

5. A heat-sensitive material for making lithographic printing plates comprising on a lithographic support an image-forming layer comprising a hydrophilic binder, a cross-linking agent for a hydrophilic binder and dispersed hydrophobic thermoplastic polymer particles, wherein said image-forming layer is covered with a layer comprising a polymer having cationic groups.

6. A heat sensitive material according to claim 5 wherein said polymer having cationic groups is a hydrophilic polymer having cationic groups.

7. A heat-sensitive material according to claim 6 wherein said hydrophilic polymer having cationic groups is a hydrophilic polymer having ammonium groups or amino groups.

8. A heat-sensitive material according to claim 7 wherein said hydrophilic polymer having cationic groups is a modified polysaccharide having ammonium groups or amino groups.

9. A heat-sensitive material according to claim 8 wherein said modified polysaccharide is a dextran or a pullulan having ammonium groups or amino groups.

10. A heat-sensitive material according to claim 5 wherein said polymer having cationic groups is present in said imaging-forming layer in an amount between 0.02 and 1.00 $g/m^2$.

11. A heat-sensitive material according to claim 5 wherein said heat-sensitive material further comprises a compound capable of converting light into heat.

12. A heat-sensitive material according to claim 11 wherein said compound capable of converting light into heat is an IR sensitive dye or pigment.

13. A method for making lithographic printing plates comprising image-wise exposing to IR-radiation a heat-sensitive material according to claim 12 thereby resulting in an increase in hydrophobicity and oleophilicity of the exposed areas without loss of hydrophilicity of the non-imaged parts.

14. A heat-sensitive material according to claim 5 wherein said image-forming layer is present in an amount between 0.5 and 20 $g/m^2$.

15. A heat-sensitive material according to claim 5 wherein said image-forming layer comprises oxides or hydroxides of beryllium, magnesium, aluminum, silicon, gadolinium, germanium, arsenic, indium, tin, antimony, tellurium, lead, bismuth, titanium or a transition metal.

16. A method for making a lithographic printing plate comprising image-wise exposing to heat a heat-sensitive material according to claim 5 thereby resulting in an increase in hydrophobicity and oleophilicity of the exposed areas without loss of hydrophilicity of the non-imaged parts.

17. A method for making a lithographic printing plate according to claim 16 wherein an image is formed by direct thermal recording.

18. A method for making lithographic printing plates according to claim 16 wherein the heat-sensitive material is mounted on a printing press.

* * * * *

UNITED STATES PATENT AND TRADEMARK OFFICE

CERTIFICATE OF CORRECTION

PATENT NO. : 6,503,684 B1
DATED : January 7, 2003
INVENTOR(S) : Joan Vermeersch et al.

It is certified that error appears in the above-identified patent and that said Letters Patent is hereby corrected as shown below:

Title page,
Item [75], Inventors, "Joan Vermeersch, Mortsel (BE); Marc Van Damme, Mortsel (BE)", should read -- Joan Vermeersch, Deinze (BE); Marc Van Damme, Mechelen (BE) --.

Column 2,
Lines 53, "$-O-CO-R^2$" should read -- $-O-R^1$ $-O-CO-R^2$ --.

Column5,
Line 66, "9.11 9" should read -- 9.11 g --.

Signed and Sealed this

Twenty-ninth Day of April, 2003

JAMES E. ROGAN
*Director of the United States Patent and Trademark Office*